(12) United States Patent
Ching et al.

(10) Patent No.: US 9,741,810 B2
(45) Date of Patent: Aug. 22, 2017

(54) STRAINED CHANNEL OF GATE-ALL-AROUND TRANSISTOR

(71) Applicant: Taiwan Semiconductor Manufacturing Company, Ltd., Hsin-Chu (TW)

(72) Inventors: Kuo-Cheng Ching, Zhubei (TW); Chi-Wen Liu, Hsin-Chu (TW); Chao-Hsiung Wang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/447,459

(22) Filed: Jul. 30, 2014

(65) Prior Publication Data

US 2016/0035849 A1 Feb. 4, 2016

(51) Int. Cl.
*H01L 21/02* (2006.01)
*H01L 29/423* (2006.01)
*H01L 21/285* (2006.01)
*H01L 29/66* (2006.01)
*H01L 29/786* (2006.01)
*H01L 29/165* (2006.01)

(52) U.S. Cl.
CPC .. *H01L 29/42392* (2013.01); *H01L 21/28556* (2013.01); *H01L 29/66545* (2013.01); *H01L 29/78696* (2013.01); *H01L 29/165* (2013.01)

(58) Field of Classification Search
CPC .................... H01L 29/42392; H01L 21/28556
See application file for complete search history.

(56) References Cited

U.S. PATENT DOCUMENTS

| | | | |
|---|---|---|---|
| 2007/0085134 A1* | 4/2007 | Anderson | H01L 27/11 257/326 |
| 2013/0140637 A1* | 6/2013 | Chang | H01L 29/7848 257/347 |
| 2014/0231872 A1* | 8/2014 | Colinge | H01L 29/66795 257/192 |
| 2015/0061013 A1* | 3/2015 | Basu | H01L 29/785 257/347 |

* cited by examiner

*Primary Examiner* — Jamie C Niesz
(74) *Attorney, Agent, or Firm* — Slater Matsil, LLP

(57) ABSTRACT

The disclosure relates to a semiconductor device. An exemplary structure for a nanowire structure comprises a first semiconductor material having a first lattice constant and a first linear thermal expansion constant; and a second semiconductor material having a second lattice constant and a second linear thermal expansion constant surrounding the first semiconductor material, wherein a ratio of the first lattice constant to the second lattice constant is from 0.98 to 1.02, wherein a ratio of the first linear thermal expansion constant to the second linear thermal expansion constant is greater than 1.2 or less than 0.8.

20 Claims, 13 Drawing Sheets

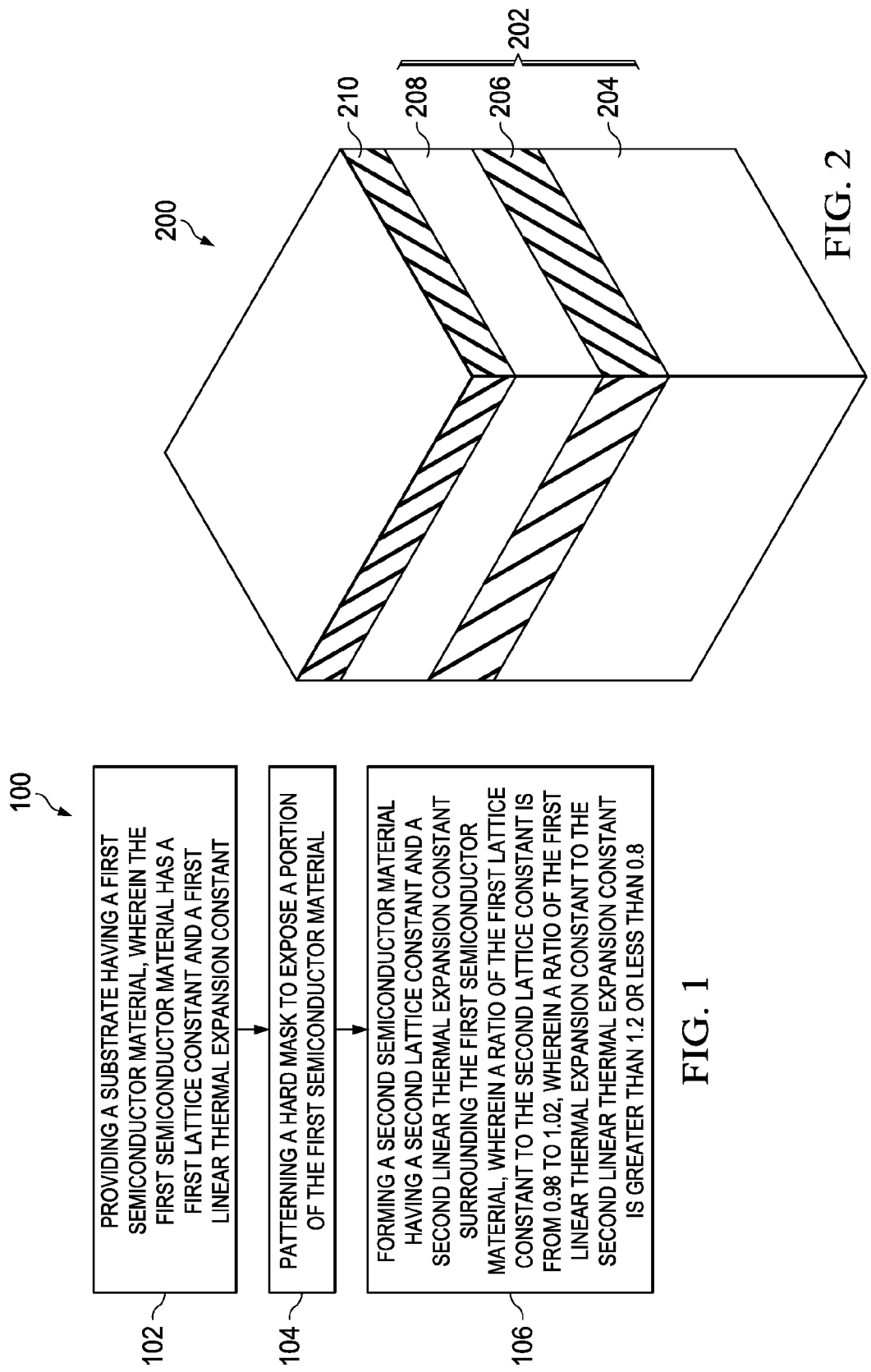

US 9,741,810 B2

STRAINED CHANNEL OF GATE-ALL-AROUND TRANSISTOR

BACKGROUND

The disclosure relates to integrated circuit fabrication, and more particularly to a semiconductor device with a strained channel.

As the semiconductor industry has progressed into nanometer technology nodes in pursuit of higher device density, higher performance, and lower costs, challenge from both fabrication and design issues have resulted in the development of three-dimensional designs, such as a gate-all-around (GAA) transistor. A typical GAA transistor enables enhanced control of the charge carriers along the lengthwise direction through a complete encirclement of the channel region of a semiconductor nanowire by a gate dielectric and a gate electrode. The GAA transistor has a reduced short channel effect, because the channel region may be surrounded by the gate electrode so that an effect of the source/drain region on an electric field of the channel region may be reduced.

However, there are challenges to implementation of such features and processes in complementary metal-oxide-semiconductor (CMOS) fabrication. For example, there is a need to increase the on-current of the GAA transistor.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 1 is a flowchart illustrating a method of fabricating a strained channel of a semiconductor device according to various aspects of the present disclosure;

FIGS. 2-12 are perspective views of a semiconductor device comprising a strained channel according to various aspects of the present disclosure;

DETAILED DESCRIPTION

Figure 3:
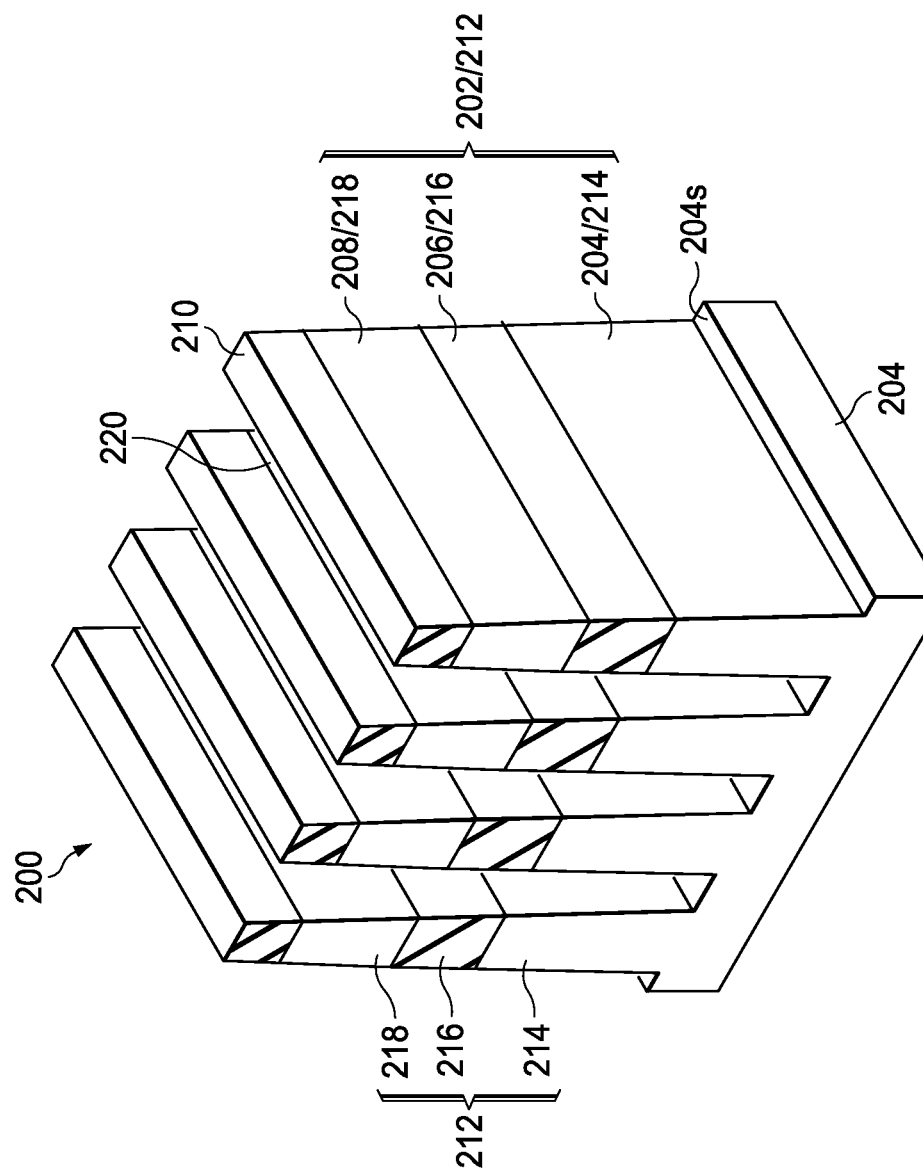

It is understood that the following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Referring to FIG. 1, illustrated is a flowchart of a method 100 of fabricating a strained channel of a semiconductor device according to various aspects of the present disclosure. The method 100 begins with step 102 in which a substrate having a first semiconductor material is provided, wherein the first semiconductor material has a first lattice constant and a first linear thermal expansion constant. The method 100 continues with step 104 in which a hard mask is patterned to expose a portion of the first semiconductor material.

The method 100 continues with step 106 in which a second semiconductor material having a second lattice constant and a second linear thermal expansion constant is formed surrounding the first semiconductor material, wherein a ratio of the first lattice constant to the second lattice constant is from 0.98 to 1.02, wherein a ratio of the first linear thermal expansion constant to the second linear thermal expansion constant is greater than 1.2 or less than 0.8. The discussion that follows illustrates embodiments of semiconductor devices that can be fabricated according to the method 100 of FIG. 1.

FIGS. 2-12 are perspective views of a semiconductor device 200 comprising a strained channel 252 according to various aspects of the present disclosure. For illustration and clarification, some portions of a dielectric layer 236 and an inter-layer dielectric (ILD) layer 246 are not shown in FIGS. 9-12. As employed in the present disclosure, the term semiconductor device 200 refers to a gate-all-around (GAA) transistor and is hereinafter referred to as GAA transistor 200. The GAA transistor 200 refers to any nanowire-based, multi-gate transistor. Other transistor structures and analogous structures are within the contemplated scope of the disclosure. The GAA transistor 200 may be included in a microprocessor, memory cell, and/or other integrated circuit (IC).

It is noted that the method of FIG. 1 does not produce a completed GAA transistor 200. A completed GAA transistor 200 may be fabricated using complementary metal-oxide-semiconductor (CMOS) technology processing. Accordingly, it is understood that additional processes may be provided before, during, and after the method 100 of FIG. 1, and that some other processes may only be briefly described herein. Also, FIGS. 1 through 12 are simplified for a better understanding of the concepts of the present disclosure. For example, although the figures illustrate the GAA transistor 200, it is understood the IC may comprise a number of other devices comprising resistors, capacitors, inductors, fuses, etc.

Referring to FIG. 2 and step 102 in FIG. 1, a substrate 202 is provided. In some embodiments, the substrate 202 comprises a semiconductor-on-insulator (SOI) substrate 202. In some embodiments, the semiconductor-on-insulator (SOI) substrate 202 includes a bottom semiconductor layer 204, a buried insulating layer 206 and a top semiconductor layer 208. In some embodiments, the top semiconductor layer 208 comprises a first semiconductor material 208a, wherein the first semiconductor material 208a has a first lattice constant and a first linear thermal expansion constant.

In some embodiments, the first semiconductor material 208a comprises Si or Ge. In some embodiments, the first semiconductor material 208a may comprise a compound semiconductor including GaP, AlP, GaAs, AlAs, InAs, GaSb, and AlSb; any other suitable material; or combinations thereof. In some embodiments, the top semiconductor layer 208 is a thin layer whose thickness is typically less than 100 nm, with commercially available SOI substrates 202 having a top semiconductor layer 208 whose thickness typically ranges from 5 nm to 90 nm. In some embodiments, the bottom semiconductor layer 204 may also include any of the above mentioned semiconductor materials, such as Si.

In some embodiments, the buried insulating layer 206 of the SOI substrate 202 may include a crystalline or non-crystalline oxide, nitride, oxynitride or any combination thereof, including a multilayered stack of such insulators. Typically, the buried insulating layer 206 is silicon dioxide. The thickness of the buried insulating layer 206 is typically from 50 nm to 200 nm, with a thickness from 100 nm to 150 nm being more typical.

In some embodiments, a hard mask 210 is formed on a top surface 208t of the top semiconductor layer 208. In some embodiments, the hard mask 210 may comprises a multi-layered structure, such as a pad layer and a mask layer over the pad layer. The pad layer may be a thin film comprising silicon oxide formed, for example, using a thermal oxidation process. The pad layer may act as an adhesion layer between the top semiconductor layer 208 and the mask layer. The pad layer may also act as an etch stop layer for etching the mask layer. In an embodiment, the mask layer is formed of silicon nitride, for example, using low-pressure chemical vapor deposition (LPCVD) or plasma enhanced chemical vapor deposition (PECVD). The mask layer is used as a hard mask during subsequent etch processes.

A photo-sensitive layer is formed on the mask layer and is then patterned, forming openings in the photo-sensitive layer (not shown). In some embodiment, the lithography processes include forming a photo-sensitive layer by spin-on coating; exposing the photo-sensitive layer using an exposure energy, such as ultraviolet (UV) light, and developing the exposed photo-sensitive layer to form the patterned photo-sensitive layer (i.e., the openings) using a developing chemical. In another example, the lithography process includes spin-on coating, soft baking, exposing, post-exposure baking, developing and hard baking. In other embodiment, the lithography process to form the patterned photoresist layer may alternatively use other technique, such as e-beam lithography, maskless patterning or molecular print.

Subsequently, the structure in FIG. 3 is produced by forming a fin structure 212 protruding from a major surface 204s of the bottom semiconductor layer 204. In some embodiments, the mask layer and pad layer are etched through openings to expose underlying SOI substrate 202. The exposed SOI substrate 202 is then etched to form trenches 220 with the major surfaces 204s of the bottom semiconductor layer 204. Portions of the SOI substrate 202 between trenches 220 form the fin structure 212. As such, each fin of the fin structure 212 includes a bottom semiconductor layer 214, a buried insulating layer 216 and a top semiconductor layer 218. In the depicted embodiment, the top semiconductor layer 218 has a lengthwise and thin body, and hence is also referred to as a nanowire 218 in the present disclosure.

In the depicted embodiment, the fin structure 212 protruding from the bottom semiconductor layer major surface 204s comprises 4 fins, although the fin structure 212 may comprise less than or more than 4 fins. The photo-sensitive layer is then removed. Next, a cleaning may be performed to remove a native oxide of the SOI substrate 202. The cleaning may be performed using diluted hydrofluoric (DHF) acid.

Figure 4:
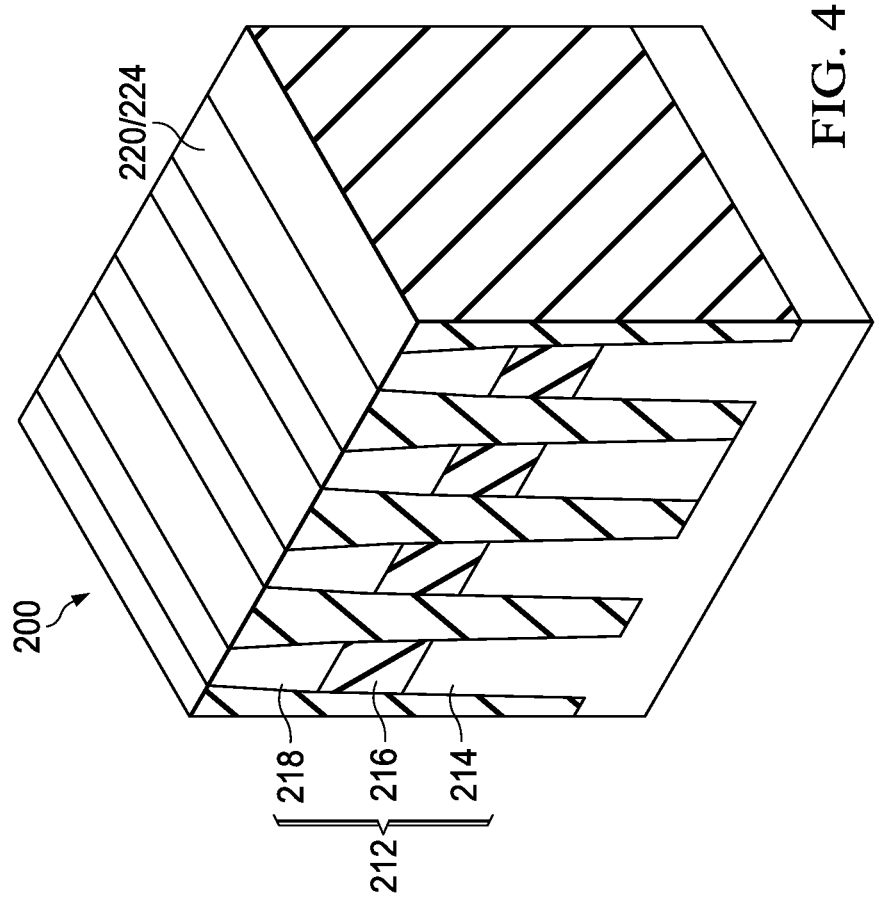

Then, the structure in FIG. 4 is produced by filling the trenches 220 with the dielectric material 224. The dielectric material 224 may include silicon oxide, and hence is also referred to as oxide 224 in the present disclosure. In some embodiments, other dielectric materials, such as silicon nitride, silicon oxynitride, fluoride-doped silicate glass (FSG), or a low-K dielectric material, may also be used. In some embodiments, the oxide 224 may be formed using a high-density-plasma (HDP) CVD process, using silane ($SiH_4$) and oxygen ($O_2$) as reacting precursors. In other embodiment, the oxide 224 may be formed using a sub-atmospheric CVD (SACVD) process or high aspect-ratio process (HARP), wherein process gases may comprise tetraethylorthosilicate (TEOS) and ozone ($O_3$). In yet other embodiment, the oxide 224 may be formed using a spin-on-dielectric (SOD) process, such as hydrogen silsesquioxane (HSQ) or methyl silsesquioxane (MSQ).

A chemical mechanical polish (CMP) is then performed to planarize the dielectric material 224, followed by the removal of the hard mask 210 (i.e., the mask layer and pad layer). In one embodiment, the mask layer is formed of silicon nitride, the mask layer may be removed using a wet process using hot H3PO4, while pad layer may be removed using DHF acid, if formed of silicon oxide.

Figure 5:
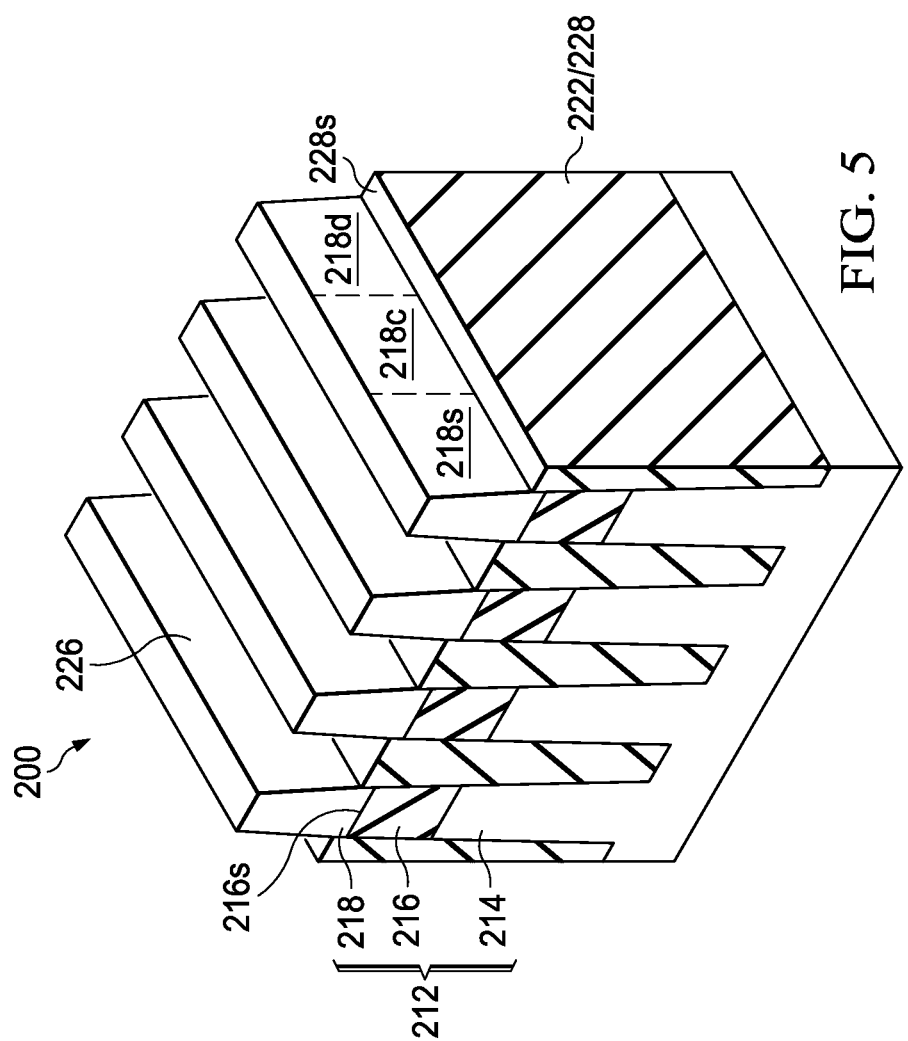

Subsequently, the structure in FIG. 5 is produced by recessing a portion of the dielectric material 224 to expose a portion of the top semiconductor layer 218, resulting in recesses 226 and a remaining oxide 222. In some embodiments, the portion of the top semiconductor layer 218 comprises a channel portion 218c between a source portion 218s and a drain portion 218d (separated by dashed line). In some embodiments, the remaining oxide 222 surrounding the fin structure 212 is hereinafter referred to as an isolation structure 228, wherein a top surface 228s of the isolation structure 228 is equal to or higher than an interface 216s between the buried insulating layer 216 and the top semiconductor layer 218.

In some embodiments, the recessing step may be performed using a wet etching process, for example, by dipping the substrate 202 in hydrofluoric acid (HF). In some embodiments, the etching step may be performed using a dry etching process, for example, the dry etching process may be performed using $CHF_3$ or $BF_3$ as etching gases.

Figure 6:
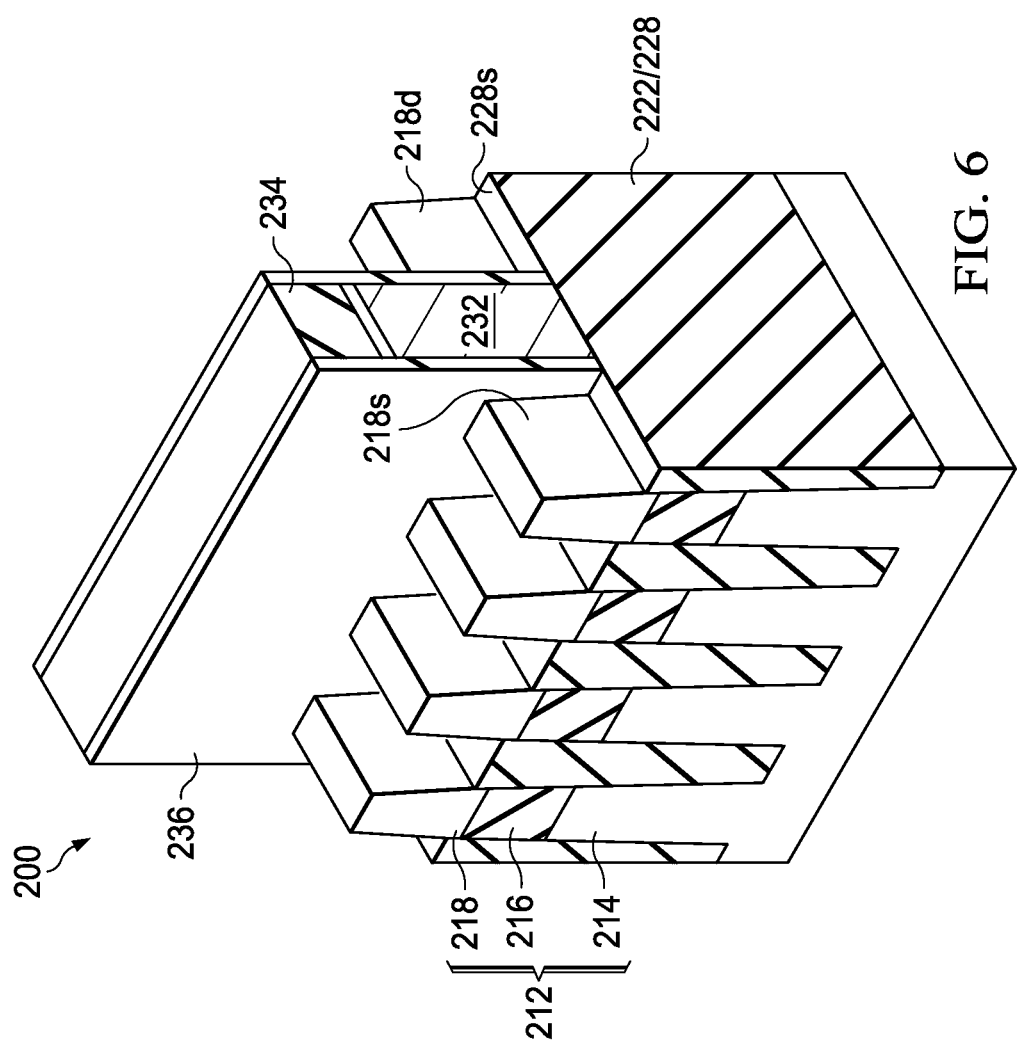
Figure 7:
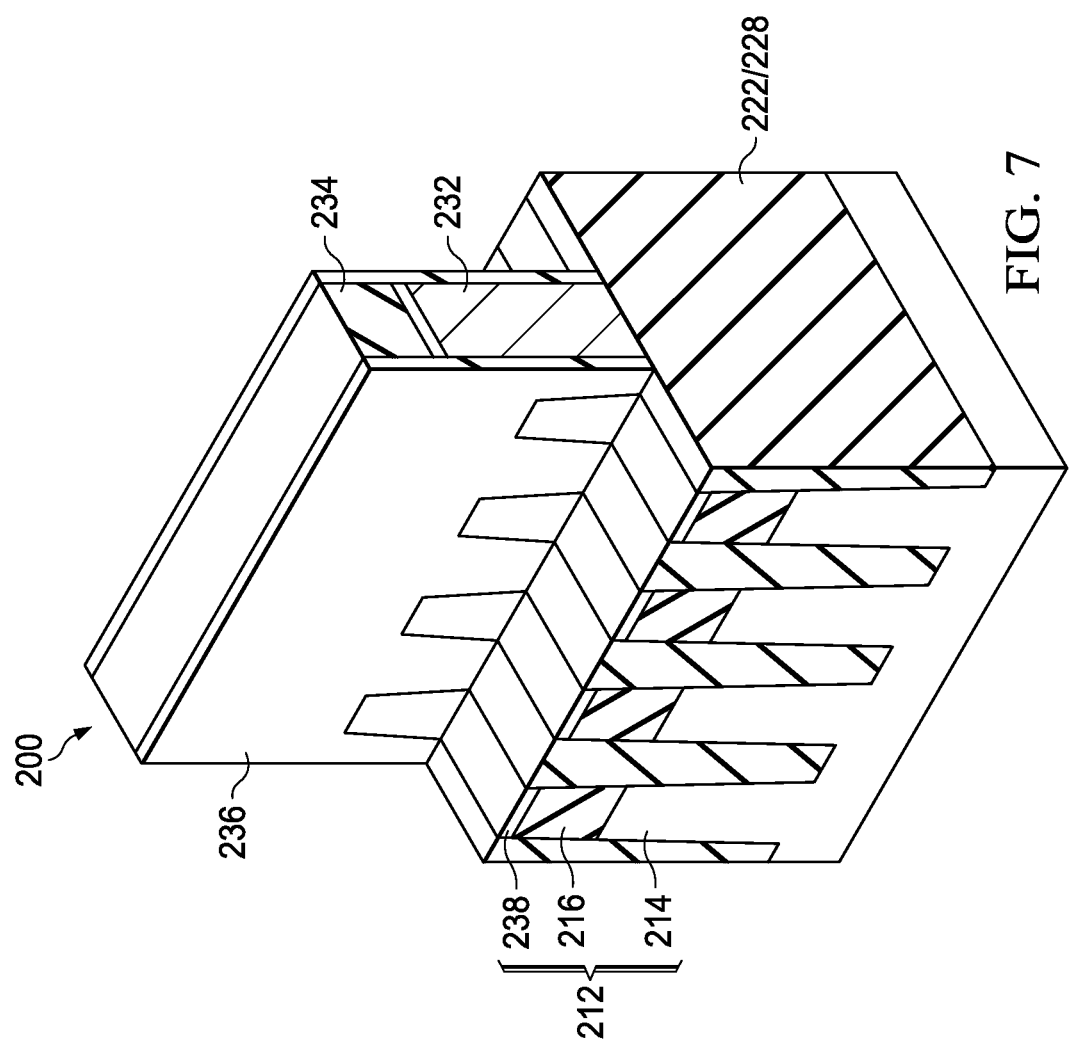

FIG. 6 shows the semiconductor device 200 of FIG. 5 after forming a dummy gate 232 over the channel portions 218c of the top semiconductor layer 218 (shown in FIG. 5) and extending to the top surface 228s of the isolation structure 228. In some embodiments, the dummy gate 232 may comprise a single layer or multilayer structure. In the present embodiment, the dummy gate 232 may comprise poly-silicon. Further, the dummy gate 232 may be doped poly-silicon with the uniform or gradient doping. The dummy gate 232 may be formed using a low-pressure chemical vapor deposition (LPCVD) process.

The dummy gate 232 may further comprise an interfacial layer (not shown) to minimize stress between the dummy gate 232 and the top semiconductor layer 218. The interfacial layer may be formed of silicon oxide or silicon oxynitride grown by a thermal oxidation process. For example, the interfacial layer can be grown by a rapid thermal oxidation (RTO) process or in a conventional annealing process comprising oxygen.

In some embodiment, a hard mask layer 234 is optionally formed over the dummy gate 232. In some embodiment, the hard mask layer 234 comprises silicon oxide. Alternatively, the hard mask layer 234 may optionally comprise silicon nitride, and/or silicon oxynitride, and may be formed using a method such as CVD or PVD.

Then, the hard mask layer 234 and the dummy gate 232 are patterned to produce the structure shown in FIG. 6. A layer of photoresist (not shown) is formed over the hard mask layer 234 by a suitable process, such as spin-on coating, and patterned to form a patterned photoresist feature over the hard mask layer 234 by a proper lithography patterning method. The patterned photoresist feature can then be transferred using a dry etching process to the underlying layers (i.e., the hard mask layer 234 and the dummy gate 232). The photoresist layer may be stripped thereafter.

Still referring to FIG. 6, the semiconductor device 200 further comprises a dielectric layer 236 formed over the substrate 202 and along the side of the dummy gate 232. In some embodiments, the dielectric layer 236 may include silicon oxide, silicon nitride, silicon oxy-nitride, or other suitable material. The dielectric layer 236 may comprise a single layer or multilayer structure. A blanket layer of the dielectric layer 236 may be formed by CVD, PVD, ALD, or other suitable technique. Then, an anisotropic etching is performed on the dielectric layer 236 to form a pair of spacers on two sides of the dummy gate 232.

Using the dummy gate 232 and the dielectric layer 236 as hard masks, a biased etching process is performed to recess the S/D portions 218s/218d of the top semiconductor layer 218 (shown in FIG. 7) that are unprotected or exposed, whereby leaving S/D seed 238 over the buried insulating layer 216. In one embodiment, the etching process may be performed using a chemical selected from $NF_3$, $CF_4$, and $SF_6$ as an etching gas. In an alternative embodiment, the etching process may be performed using a solution comprising $NH_4OH$ and $H_2O_2$.

Figure 8:
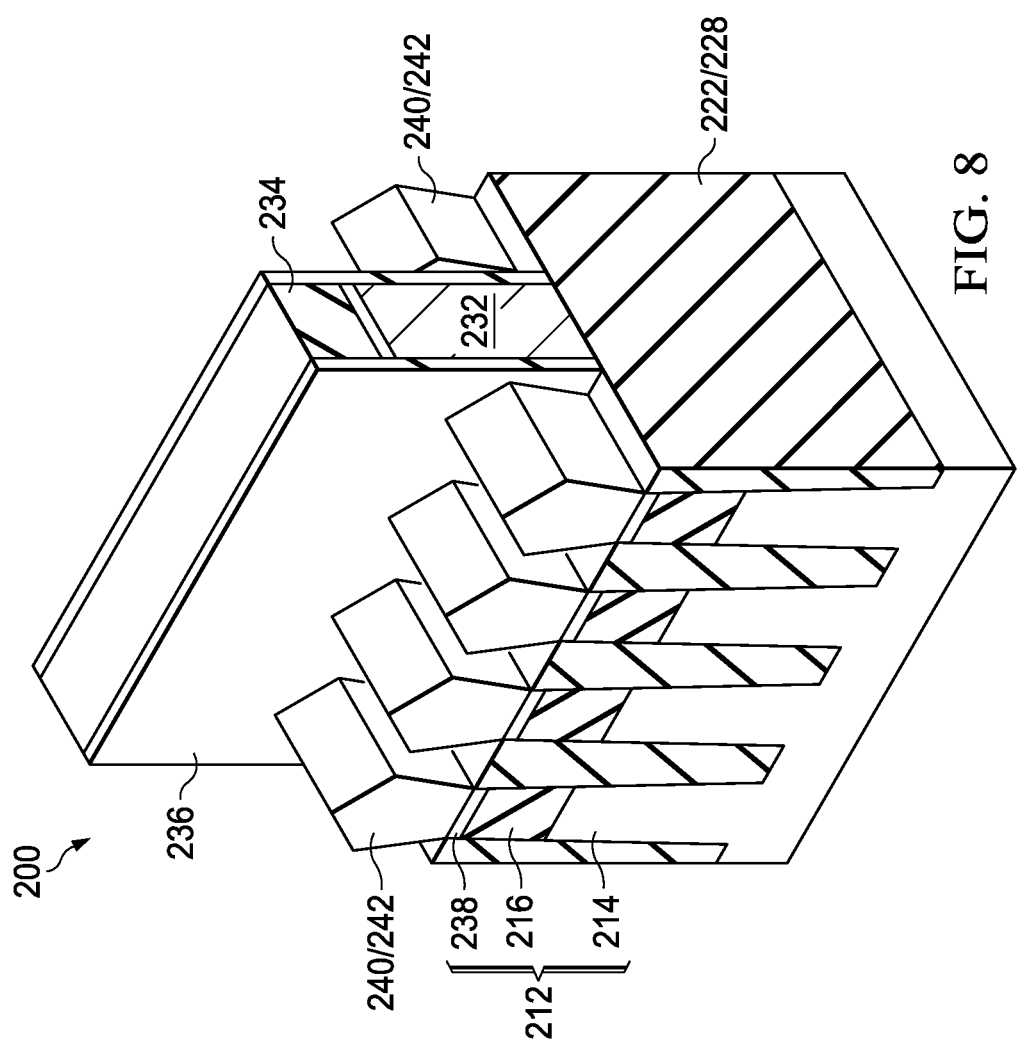

Referring to FIG. 8, after the formation of the seed 238 in the S/D portions 218s/218d, the structure in FIG. 8 is produced by epi-growing a strained material 240 on the S/D seed 238, wherein the lattice constant of the strained material 240 is different from the lattice constant of the top semiconductor layer 218. In some embodiments, the strained material 240 comprises SiGe for a p-type GAA if the top semiconductor layer 218 is Si, wherein the lattice constant of the strained material 240 is greater than the lattice constant of the top semiconductor layer 218. In some embodiments, the strained material 240 comprises SiC for an n-type GAA if the top semiconductor layer 218 is Si, wherein the lattice constant of the strained material 240 is less than the lattice constant of the top semiconductor layer 218

In the SiGe-growing embodiment, a pre-cleaning process may be performed to clean the S/D seed 238 with HF or other suitable solution. Then, the strained material 240 such as silicon germanium (SiGe) is selectively grown by an LPCVD process to form S/D regions 242. In one embodiment, the LPCVD process is performed at a temperature of about 660° C. to about 700° C. and under a pressure of about 13 to about 50 Torr, using $SiH_2Cl_2$, HCl, $GeH_4$, $B_2H_6$, and $H_2$ as reaction gases. In the illustrated embodiment, the source and drain regions provide strain to the channel region, which improves carrier mobility in many applications. In other applications, the strained source and drain region is not necessary, in which case the source and drain regions could be formed by simply doping of the fin, without the need for the added complexity of forming a recess, epi-growing the strained material, and the like processes.

Figure 9:
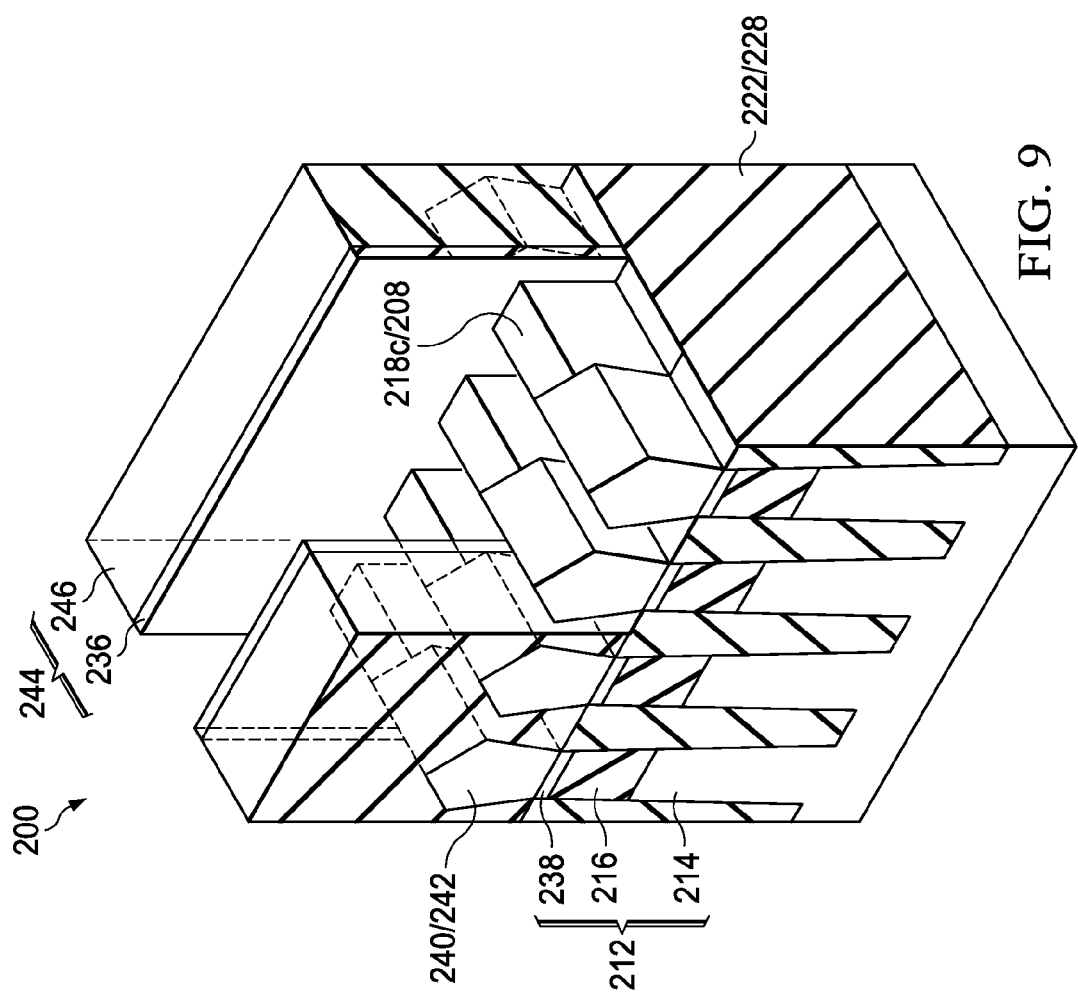

Subsequently, the structure in FIG. 9 is produced by patterning a hard mask 244 to expose a portion of the first semiconductor material 208 (step 104 in FIG. 1). In the depicted embodiment, an inter-layer dielectric (ILD) layer 246 is formed over the S/D regions 242, the dielectric layer 236, and the dummy gate 232. The ILD layer 246 may include an oxide formed by a high-aspect-ratio process (HARP) and/or a high-density-plasma (HDP) deposition process. After the ILD layer 246 deposition, a CMP process is performed on the ILD layer 246 to expose the dummy gate 232. Only a portion of the hard mask 244 is shown in FIG. 9 (and in subsequent FIGS. 10-12), in order to better illustrate aspects of the disclosure. One skilled in the art will recognize that the hard mask 244 is actually formed over all of the respective S/D regions 242—but the entire hard mask 244 is not illustrated in the drawings so that features of the channel regions 218c (FIG. 9)/nanowire 208n (FIG. 10)/ nanowire structure 252 (FIG. 11) are not obscured.

Then, using the ILD layer 246 and the dielectric layer 236 as a patterned hard mask 244, the dummy gate 232 may be removed using a wet etch and/or a dry etch process to expose the channel portions 218c (i.e., the portion of the first semiconductor material 208). In at least one embodiment, the wet etch process for dummy poly-silicon gate 232 includes exposure to a hydroxide solution containing ammonium hydroxide, diluted HF, deionized water, and/or other suitable etchant solutions. In some embodiments, the dry etch process for dummy poly-silicon gate 232 may be performed under a source power of about 650 to 800 W, a bias power of about 100 to 120 W, and a pressure of about 60 to 200 mTorr, using $Cl_2$, HBr and He as etching gases.

Figure 10:
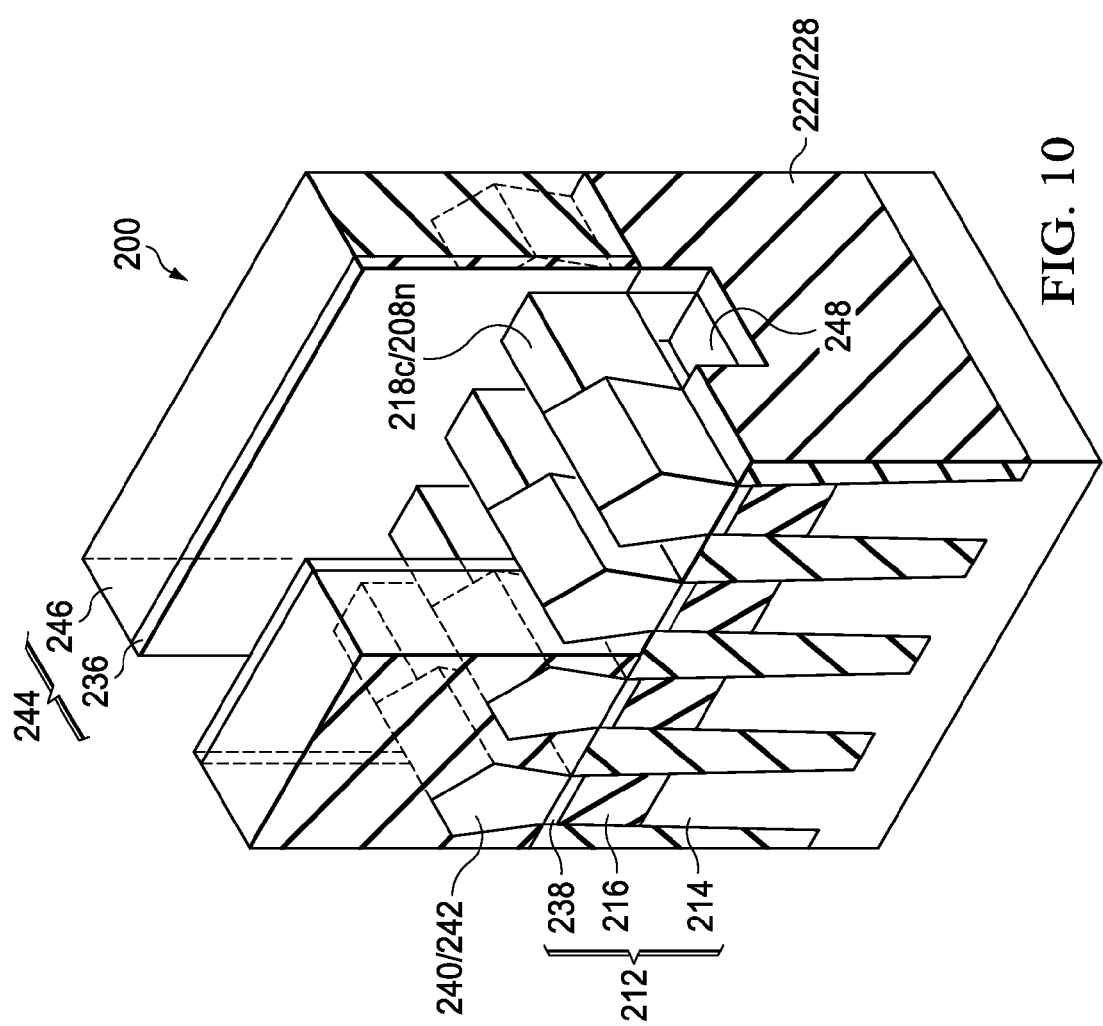

In order to form a nanowire between the S/D regions 242, the structure in FIG. 10 is produced by further recessing a portion of the remaining oxide 222 and a portion of the buried insulating layer 216 below the channel portion 218c to expose a bottom surface of the channel portion 218c, resulting in recesses 248 and the nanowire 208n.

In some embodiments, the recessing step may be performed using a wet etching process, for example, by dipping the substrate 202 in hydrofluoric acid (HF). In some embodiments, the etching step may be performed using a dry etching process, for example, the dry etching process may be performed using $CHF_3$ or $BF_3$ as etching gases.

The process steps up to this point have provided the substrate 202 having the nanowire 208n between the S/D regions 242. Conventionally, a gate dielectric and a gate electrode are formed to surround the channel region of the semiconductor nanowire to complete GAA transistor fabrication. The gate electrode induces an amount of electric field into channel region of a GAA transistor. Typically, this amount of field is effective to turn the GAA transistor on when a gate voltage is applied, but limits the amount of current available when the channel is not or less strained. As such, there is a need to increase the on-current of the GAA transistor. Typically, the GAA transistor with strained channel region may increase the on-current of the GAA transistor.

Figure 13:
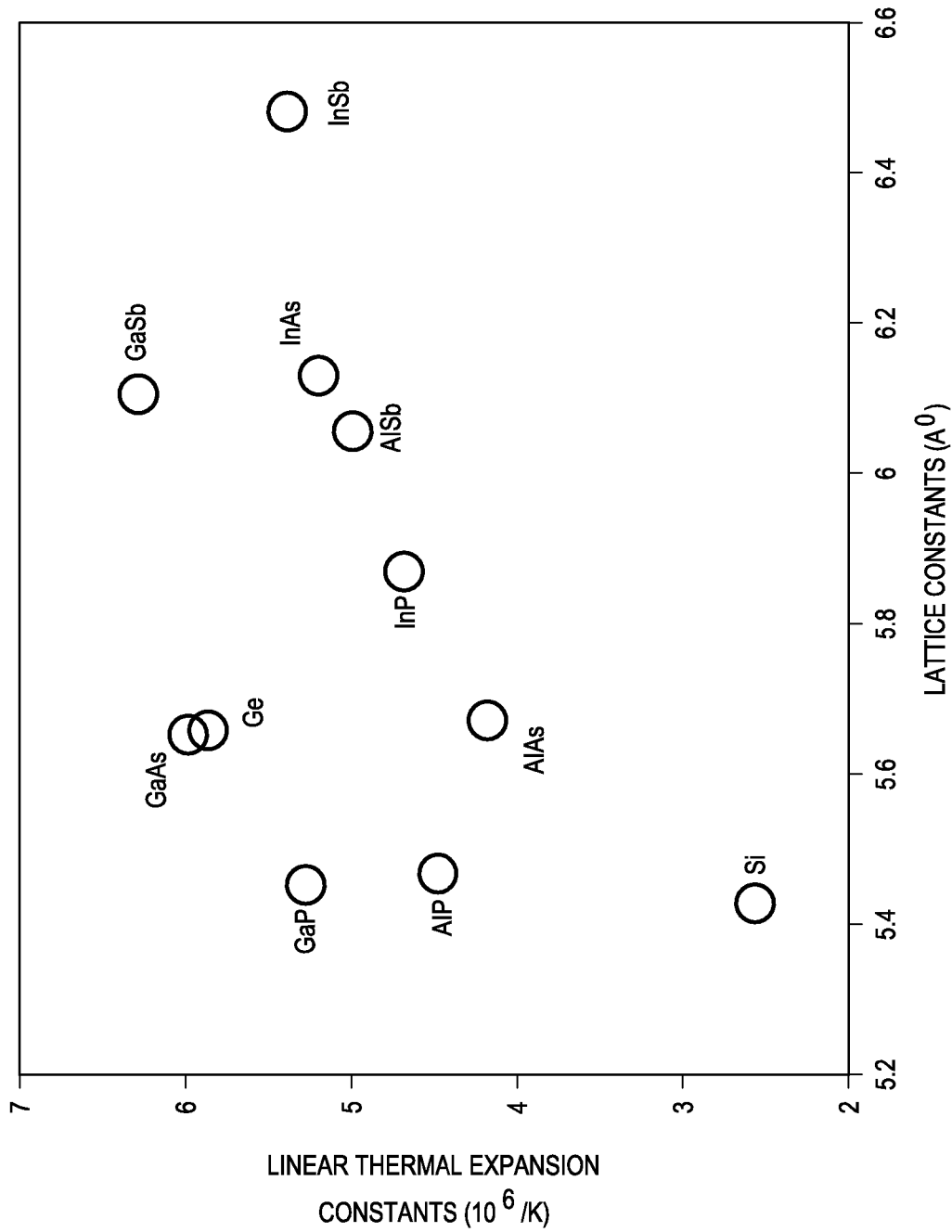
FIG. 13 is a graph illustrating the relationship between lattice constant, linear thermal expansion constant, and semiconductor material.

FIG. 13 is a graph illustrating the relationship between lattice constant, linear thermal expansion constant, and semiconductor material.

In some embodiments, the first lattice constant of GaSb is approximately the same as the second lattice constant (about 6.1 angstroms) of InAs and AlSb, wherein a ratio of the first lattice constant to the second lattice constant is from 0.98 to 1.02. It should be noted that a ratio of a first linear thermal expansion constant of GaSb to a second linear thermal expansion constant of InAs and AlSb is greater than 1.2, or a ratio of a second linear thermal expansion constant of InAs and AlSb to a first linear thermal expansion constant of GaSb is less than 0.8. As such, GaSb is easily grown on InAs or AlSb due to less lattice mismatch, while InAs or AlSb may strain GaSb through thermal expansion during device operation, and vice versa.

In some embodiments, the first lattice constant of Ge and GaAs is approximate the same as the second lattice constant (about 5.7 angstroms) of AlAs, wherein a ratio of the first lattice constant to the second lattice constant is from 0.98 to 1.02. It should be noted that a ratio of a first linear thermal expansion constant of Ge and GaAs to a second linear thermal expansion constant of AlAs is greater than 1.5, or ratio of a second linear thermal expansion constant of AlAs to a first linear thermal expansion constant of Ge and GaAs is less than 0.7. As such, Ge or GaAs is easily grown on AlAs due to less lattice mismatch, while AlAs may strain Ge or GaAs through thermal expansion during device operation, and vice versa.

In some embodiments, the first lattice constant of AlP and GaP is approximate the same as the second lattice constant (about 5.45 angstroms) of Si, wherein a ratio of the first lattice constant to the second lattice constant is from 0.98 to 1.02. It should be noted that a ratio of a first linear thermal expansion constant of AlP and GaP to a second linear thermal expansion constant of Si is greater than 3, or a ratio of a second linear thermal expansion constant of Si to a first linear thermal expansion constant of AlP and GaP is less than 0.35. As such, AlP or GaP is easily grown on Si due to less lattice mismatch, while Si may strain AlP or GaP through thermal expansion during device operation, and vice versa.

Accordingly, the processing discussed below with reference to FIG. 11 may form a nanowire with multiple semiconductor materials to replace the nanowire with single semiconductor material. The nanowire with multiple semiconductor materials may increase the on-current through straining the channel portion, thereby enhancing the device performance.

Figure 11:
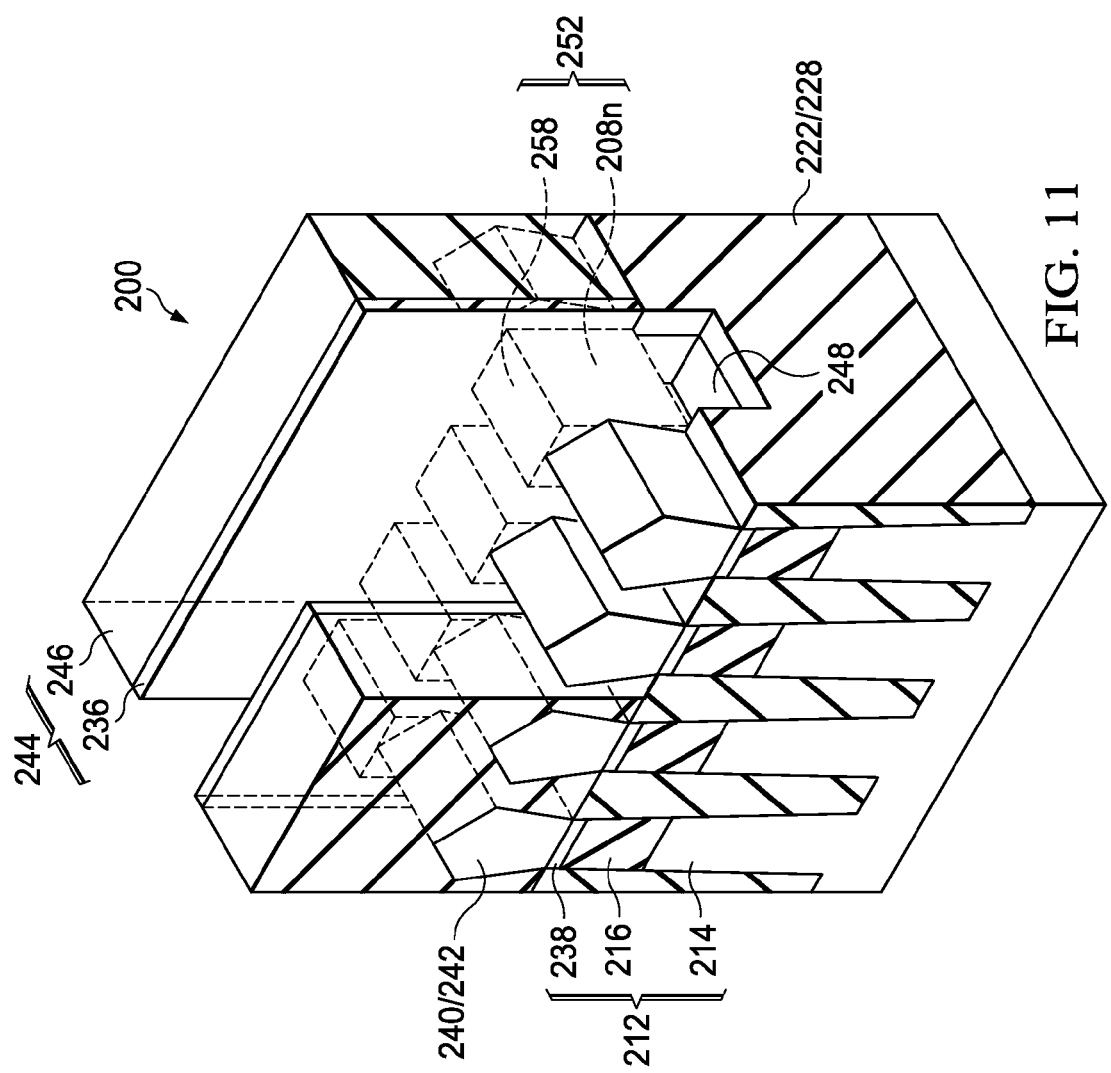

Referring to FIG. 11 and step 106 in FIG. 1, following the formation of the recesses 248 and the nanowire 208n, the structure in FIG. 11 is produced by forming a second semiconductor material 258 having a second lattice constant and a second linear thermal expansion constant surrounding the first semiconductor material 208 (i.e., the nanowire 208n), wherein a ratio of the first lattice constant to the second lattice constant is from 0.98 to 1.02, wherein a ratio of the first linear thermal expansion constant to the second linear thermal expansion constant is greater than 1.2 or less than 0.8. In some embodiments, the first semiconductor material 208 (i.e., the nanowire 208n) and the second semiconductor material 258 are combined and referred to as a nanowire structure 252.

In some embodiments, one of the first semiconductor material 208 and the second semiconductor material 258 is Si and the other comprises AlP or GaP. In some embodiments configured for an n-type GAA transistor, the first semiconductor material 208 is Si and the second semiconductor material 258 is AlP or GaP. In some embodiments configured for a p-type GAA transistor, the first semiconductor material 208 is AlP or GaP and the second semiconductor material 258 is Si.

In some embodiments, one of the first semiconductor material 208 and the second semiconductor material 258 is AlAs and the other comprises Ge or GaAs. In some embodiments configured for an n-type GAA transistor, the first semiconductor material 208 is AlAs and the second semiconductor material 258 is Ge or GaAs. In some embodiments configured for a p-type GAA transistor, the first semiconductor material 208 is Ge or GaAs and the second semiconductor material 258 is AlAs.

In some embodiments, one of the first semiconductor material 208 and the second semiconductor material 258 is GaSb and the other comprises InAs or AlSb. In some embodiments configured for an n-type GAA transistor, the first semiconductor material 208 is InAs or AlSb and the second semiconductor material 258 is GaSb. In some embodiments configured for a p-type GAA transistor, the first semiconductor material 208 is GaSb and the second semiconductor material 258 is InAs or AlSb.

In some embodiments, the second semiconductor material 258 is Ge if the first semiconductor material 208 is AlAs. In the Ge-growing embodiment, a pre-cleaning process may be performed to clean the AlAs nanowire 218 with HF or other suitable solution. Then, the strained material (i.e., the second semiconductor material 258) such as Ge is selectively grown by an LPCVD process to surround the AlAs nanowire 218. In one embodiment, the LPCVD process is performed at a temperature of about 350° C. to about 450° C., under a pressure of about 10 mTorr to about 100 mTorr, using $GeH_4$, $GeH_3CH_3$, and/or $(GeH_3)_2CH_2$ as gas precursors.

Figure 12:
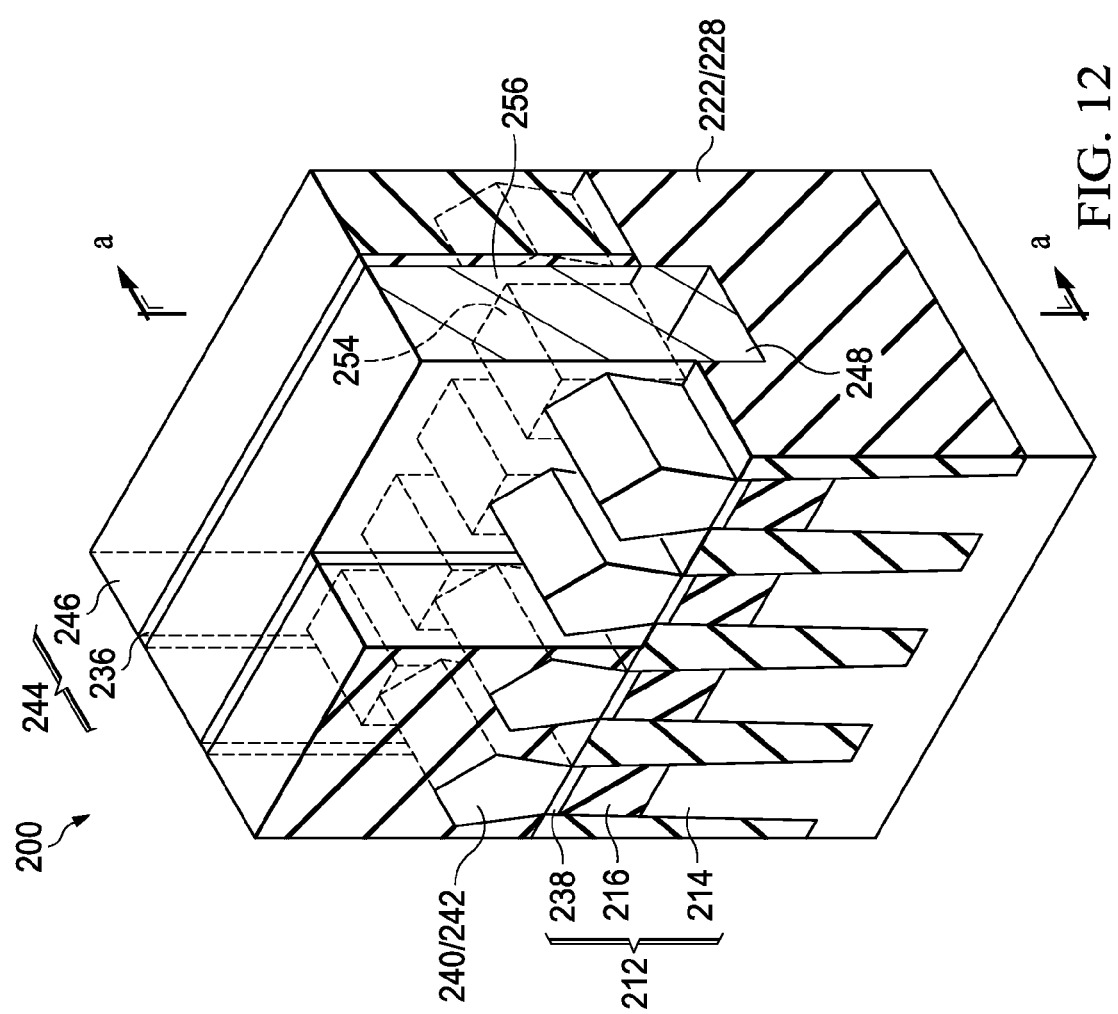

FIG. 12 shows the semiconductor device 200 of FIG. 11 after forming a gate dielectric 254 over the nanowire structure 252. In some embodiments, the gate dielectric 254 may include silicon oxide, silicon nitride, silicon oxynitride, or high-k dielectrics. High-k dielectrics comprise metal oxides. Examples of metal oxides used for high-k dielectrics include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu and mixtures thereof. In the present embodiment, the gate dielectric 254 is a high-k dielectric layer with a thickness in the range of about 5 to 30 angstroms. The gate dielectric 254 may be formed using a suitable process such as atomic layer deposition (ALD), chemical vapor deposition (CVD), physical vapor deposition (PVD), thermal oxidation, UV-ozone oxidation, or combinations thereof. The gate dielectric 254 may further comprise an interfacial layer (not shown) to reduce damage between the gate dielectric 254 and the nanowire structure 252. The interfacial layer may comprise silicon oxide.

Then, the structure in FIG. 12 is produced by forming a layer of metal over the gate dielectric 254. In some embodiments, the layer of metal may comprise a single layer or multilayer structure. In the present embodiment, the layer of metal may include a metal such as Al, Cu, W, Ti, Ta, TiN, TiAl, TiAlN, TaN, TaC, NiSi, CoSi, other conductive materials with a work function compatible with the substrate material, or combinations thereof. The layer of metal may be formed using a suitable process such as ALD, CVD, PVD, plating, or combinations thereof. Subsequently, a CMP process is performed on the layer of metal to form a metal gate 256 surrounding the channel portion of the nanowire 252.

Figure 14:
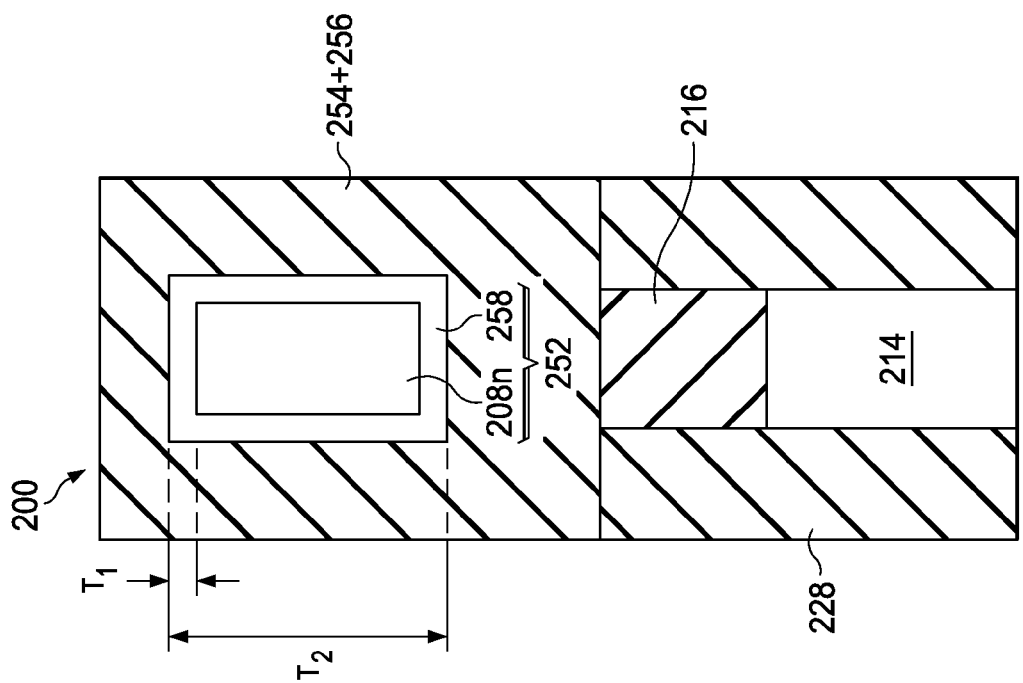
FIG. 14 is a cross-sectional view of a semiconductor device taken along the line a-a of FIG. 12 at various stages of fabrication according to various embodiments of the present disclosure.

FIG. 14 is a cross-sectional view of a semiconductor device taken along the line a-a of FIG. 12 at various stages of fabrication according to various embodiments of the present disclosure. In some embodiments, the cross-sectional shape of the first semiconductor 208 comprises square (not shown) or rectangular (shown in FIG. 14). In some embodiments, a ratio of a thickness T1 of the second semiconductor 258 to a thickness T2 of the nanowire structure 252 is from 0.05 to 0.5.

Figure 15:
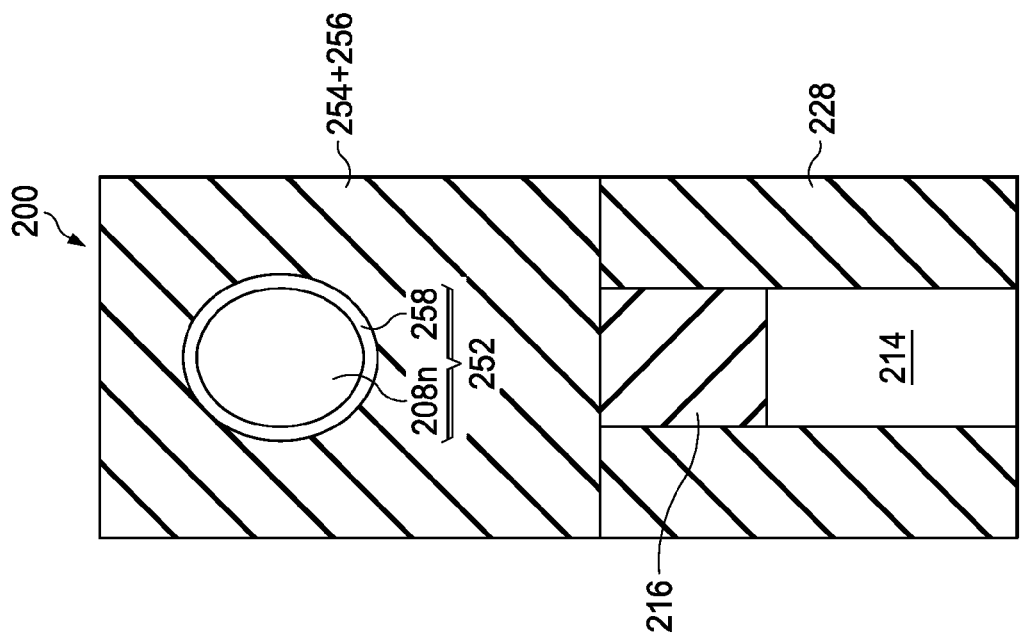
FIG. 15 is a cross-sectional view of a semiconductor device taken along the line a-a of FIG. 12 at various stages of fabrication according to various embodiments of the present disclosure.

FIG. 15 is a cross-sectional views of a semiconductor device taken along the line a-a of FIG. 12 at various stages of fabrication according to various embodiments of the present disclosure. In some embodiments, the cross-sectional shape of the first semiconductor 208 comprises circle (shown in FIG. 15) or ellipse (not shown). In some embodiments, the nanowire structure 252 comprises more than one nanowire, such as 2 nanowires or 5 nanowires (not shown).

In some embodiments, the semiconductor device 200 comprises a source region and a drain region 242; a nanowire structure 252 between the source region and drain region 242 comprising a first semiconductor material 208 having a first lattice constant and a first linear thermal expansion constant, and a second semiconductor material 258 having a second lattice constant and a second linear thermal expansion constant surrounding the first semiconductor material 208, wherein a ratio of the first lattice constant to the second lattice constant is from 0.98 to 1.02, wherein a ratio of the first linear thermal expansion constant to the second linear thermal expansion constant is greater than 1.2 or less than 0.8; and a metal gate 256 surrounding a channel portion of the nanowire structure 252.

As such, using form a nanowire with multiple semiconductor materials to increase the on-current through straining the channel portion, problems associated with low on-current due to not or less strained channel may be reduced and/or avoided. Thus, Applicant's method may achieve the desired device performance characteristics, such as high on-current.

After the steps shown in FIG. 1, as further illustrated with respect to the example depicted in FIGS. 2-12, have been performed, subsequent processes, comprising interconnect processing, are typically performed to complete the semiconductor device 200 fabrication.

In accordance with one embodiment, a nanowire structure comprises a first semiconductor material having a first lattice constant and a first linear thermal expansion constant; and a second semiconductor material having a second lattice constant and a second linear thermal expansion constant surrounding the first semiconductor material, wherein a ratio of the first lattice constant to the second lattice constant is from 0.98 to 1.02, wherein a ratio of the first linear thermal expansion constant to the second linear thermal expansion constant is greater than 1.2 or less than 0.8.

In accordance with another embodiment, a semiconductor device comprises a source region and a drain region; a nanowire structure between the source region and drain region comprising a first semiconductor material having a first lattice constant and a first linear thermal expansion constant, and a second semiconductor material having a second lattice constant and a second linear thermal expansion constant surrounding the first semiconductor material, wherein a ratio of the first lattice constant to the second lattice constant is from 0.98 to 1.02, wherein a ratio of the first linear thermal expansion constant to the second linear thermal expansion constant is greater than 1.2 or less than 0.8; and a metal gate surrounding a channel portion of the nanowire structure.

In accordance with another embodiments, a method of fabricating a semiconductor device comprises providing a substrate having a first semiconductor material, wherein the first semiconductor material has a first lattice constant and a first linear thermal expansion constant; patterning a hard mask to expose a portion of the first semiconductor material; and forming a second semiconductor material having a second lattice constant and a second linear thermal expansion constant surrounding the first semiconductor material, wherein a ratio of the first lattice constant to the second lattice constant is from 0.98 to 1.02, wherein a ratio of the first linear thermal expansion constant to the second linear thermal expansion constant is greater than 1.2 or less than 0.8.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A structure comprising:
   a fin comprising:
      a bottom semiconductor layer;
      a first insulating layer over the bottom semiconductor layer; and
      a first semiconductor material over the first insulating layer, wherein the first insulating layer comprises a same material extending from the bottom semiconductor layer to the first semiconductor material, the first semiconductor material having a first lattice constant and a first linear thermal expansion constant, a middle portion of the first semiconductor material extending further away from the bottom semiconductor layer than a first end portion and a second end portion of the first semiconductor material;
   isolation structures comprising a dielectric material and on opposing sides of the fin, wherein the isolation structures contact sidewalls of the bottom semiconductor layer of the fin, wherein the isolation structures extend above an upper surface of the first insulating layer;
   a source region overlying the first end portion of the first semiconductor material, with the first semiconductor material disposed between the source region and the first insulating layer of the fin;
   a drain region overlying the second end portion of the first semiconductor material, with the first semiconductor material disposed between the drain region and the first insulating layer of the fin;
   a channel region between the source region and the drain region, the channel region comprising the middle portion of the first semiconductor material; and
   a second semiconductor material having a second lattice constant and a second linear thermal expansion constant surrounding the channel region,
   wherein a ratio of the first lattice constant to the second lattice constant is from 0.98 to 1.02, and wherein a ratio of the first linear thermal expansion constant to the second linear thermal expansion constant is greater than 1.2 or less than 0.8.

2. The structure of claim 1, wherein one of the first semiconductor material and the second semiconductor material is Si and the other comprises AlP or GaP.

3. The structure of claim 1, wherein one of the first semiconductor material and the second semiconductor material is AlAs and the other comprises Ge or GaAs.

4. The structure of claim 1, wherein one of the first semiconductor material and the second semiconductor material is GaSb and the other comprises InAs or AlSb.

5. The structure of claim 1, wherein the first end portion, the second end portion, and the middle portion of the first semiconductor material are connected continuously without an interface.

6. The structure of claim 1, further comprising:
a gate dielectric around the second semiconductor material; and
a metal gate around the gate dielectric, wherein the metal gate extends into the first insulating layer of the fin.

7. The structure of claim 1, wherein the source region and drain region comprise a different material than the first semiconductor material, and wherein the source region and the drain region have a width larger than a width of the fin in a cross-sectional view.

8. A semiconductor device comprising:
a fin comprising:
 a semiconductor layer;
 an insulating layer over and contacting the semiconductor layer; and
 a first semiconductor material over and contacting the insulating layer, wherein the insulating layer comprises a same material extending from the semiconductor layer to the first semiconductor material;
a dielectric material contacting opposing sidewalls of the semiconductor layer of the fin;
a source region over the fin and a drain region over the fin;
a nanowire structure between the source region and drain region, the nanowire structure comprising:
 the first semiconductor material having a first lattice constant and a first linear thermal expansion constant, wherein the first semiconductor material underlies and separates the source region and the drain region from the insulating layer of the fin, wherein the first semiconductor material extends continuously from the source region to the drain region, and
 a second semiconductor material having a second lattice constant and a second linear thermal expansion constant surrounding the first semiconductor material, wherein a ratio of the first lattice constant to the second lattice constant is from 0.98 to 1.02, wherein a ratio of the first linear thermal expansion constant to the second linear thermal expansion constant is greater than 1.2 or less than 0.8; and
a metal gate surrounding a channel portion of the nanowire structure.

9. The semiconductor device of claim 8, wherein one of the first semiconductor material and the second semiconductor material is Si and the other comprises AlP or GaP.

10. The semiconductor device of claim 8, wherein one of the first semiconductor material and the second semiconductor material is AlAs and the other comprises Ge or GaAs.

11. The semiconductor device of claim 8, wherein one of the first semiconductor material and the second semiconductor material is GaSb and the other comprises InAs or AlSb.

12. The semiconductor device of claim 8, wherein a ratio of a thickness of the second semiconductor material to a thickness of the nanowire structure is from 0.05 to 0.5.

13. The semiconductor device of claim 8, wherein a lattice constant of the source region is different from the lattice constant of the first semiconductor material.

14. The semiconductor device of claim 8, wherein the source region comprise SiGe or SiC, and the first semiconductor material comprises Si.

15. The semiconductor device of claim 8, further comprising a dielectric layer over the source region and the drain region, wherein an upper surface of the dielectric layer is substantially level with an upper surface of the metal gate.

16. The semiconductor device of claim 15, wherein the metal gate extends into the insulating layer of the fin.

17. The semiconductor device of claim 16, wherein the first semiconductor material extends below an uppermost surface of the dielectric material.

18. A Gate-All-Around (GAA) transistor comprising:
a fin comprising:
 a lower semiconductor portion protruding above an upper surface of a substrate;
 a first semiconductor material over the lower semiconductor portion; and
 an insulating layer between the lower semiconductor portion and the first semiconductor material, wherein the insulating layer comprises a same material extending from the lower semiconductor portion to the first semiconductor material;
an epitaxial source region over the fin; an epitaxial drain region over the fin;
isolation structures comprising a dielectric material and contacting opposing sidewalls of the lower semiconductor portion of the fin, wherein an uppermost surface of the isolation structures is above an uppermost surface of the insulating layer;
a nanowire structure disposed between and connected to the source region and the drain region, the nanowire structure comprising:
 the first semiconductor material with a first lattice constant and a first linear thermal expansion constant, wherein the first semiconductor material underlies the source region and the drain region, and the first semiconductor material being disposed between the source region and the drain region; and
 a second semiconductor material around the first semiconductor material, the second semiconductor material having a second lattice constant substantially matched to the first lattice constant, and a second linear thermal expansion constant different from the first linear thermal expansion constant,
 wherein a third lattice constant of the source region is different from the first lattice constant of the first semiconductor material, and wherein a ratio of the first linear thermal expansion constant to the second linear thermal expansion constant is greater than 1.2 or less than 0.8; and a metal gate around a middle portion of the nanowire structure.

19. The GAA transistor of claim 18, wherein a ratio of the first lattice constant to the second lattice constant is from 0.98 to 1.02.

20. The GAA transistor of claim 18, wherein the metal gate extends below the uppermost surface of the isolation structures and an uppermost surface of the insulating layer of the fin, wherein the first semiconductor material is disposed between the source region and the insulating layer of the fin.

* * * * *